United States Patent
Okajima et al.

(10) Patent No.: US 10,470,258 B2
(45) Date of Patent: Nov. 5, 2019

(54) HIGH FREQUENCY HEATING DEVICE

(71) Applicant: Panasonic Intellectual Property Management Co., Ltd., Osaka-shi, Osaka (JP)

(72) Inventors: Toshiyuki Okajima, Shiga (JP); Yoshiharu Oomori, Shiga (JP); Koji Yoshino, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 153 days.

(21) Appl. No.: 15/537,216

(22) PCT Filed: Jul. 27, 2016

(86) PCT No.: PCT/JP2016/003463
§ 371 (c)(1),
(2) Date: Jun. 16, 2017

(87) PCT Pub. No.: WO2017/056358
PCT Pub. Date: Apr. 6, 2017

(65) Prior Publication Data
US 2017/0347410 A1 Nov. 30, 2017

(30) Foreign Application Priority Data
Sep. 28, 2015 (JP) ................. 2015-189595

(51) Int. Cl.
*H05B 6/70* (2006.01)
*H05B 6/72* (2006.01)
(Continued)

(52) U.S. Cl.
CPC ............. *H05B 6/707* (2013.01); *H01Q 13/08* (2013.01); *H02P 27/085* (2013.01); *H05B 6/681* (2013.01);
(Continued)

(58) Field of Classification Search
CPC ........ H05B 6/681; H05B 6/708; H05B 6/686; H05B 6/707; H05B 2206/044; H01Q 13/08; H01J 37/32302
(Continued)

(56) References Cited

U.S. PATENT DOCUMENTS 4,634,992 A * 1/1987 Brown .................... H03F 3/602
 330/286
5,558,800 A * 9/1996 Page ........................ H05B 6/72
 219/695
(Continued)

FOREIGN PATENT DOCUMENTS

EP 2205043 A1 7/2010
EP 2568777 A1 3/2013
(Continued)

OTHER PUBLICATIONS

The Extended European Search Report dated Aug. 23, 2018 for the related European Patent Application No. 16850543.6.
(Continued)

*Primary Examiner* — Quang T Van
(74) *Attorney, Agent, or Firm* — Brinks Gilson & Lione

(57) ABSTRACT

High frequency heating device is provided with heater disposed adjacent to mount base on which object to be heated is mounted and having a plurality of surface wave transmission lines electrically isolated from each other, and first and second high frequency power generators, each of which generates high frequency power having different frequency. Surface wave transmission lines receive at least one of the high frequency power generated by first high frequency power generator and the high frequency power generated by second high frequency power generator. According to this aspect, interference between the high frequency powers is not occurred and electromagnetic field coupling is not occurred. As a result, in the high frequency heating device provided with the surface wave transmission line using a periodic structure, uneven baking caused by the electromagnetic field coupling can be suppressed, and a heating state of an object to be heated can be easily controlled.

5 Claims, 8 Drawing Sheets

(51) Int. Cl.
*H03F 3/60* (2006.01)
*H01Q 13/08* (2006.01)
*H02P 27/08* (2006.01)
*H05B 6/68* (2006.01)
*H01J 37/32* (2006.01)

(52) U.S. Cl.
CPC ............ *H05B 6/686* (2013.01); *H05B 6/708* (2013.01); *H01J 37/32302* (2013.01); *H05B 2206/044* (2013.01)

(58) Field of Classification Search
USPC ....... 219/647, 702, 705, 709, 761, 748, 695, 219/746; 333/128, 125, 101; 330/47, 48, 330/53, 286, 295; 331/107 R, 110, 62
See application file for complete search history.

(56) References Cited

U.S. PATENT DOCUMENTS

2008/0272114 A1    11/2008   Taguchi et al.
2010/0176123 A1*   7/2010    Mihara .................. H05B 6/686
                                                        219/746
2013/0240757 A1    9/2013    Einziger et al.
2014/0197761 A1    7/2014    Grandemenge et al.

FOREIGN PATENT DOCUMENTS

| JP | 57-124381   | 8/1982 |
| JP | 8-166133    | 6/1996 |
| JP | 2000-150136 | 5/2000 |
| JP | 2009-016149 | 1/2009 |
| JP | 2009-032638 | 2/2009 |
| JP | 2014-116246 | 6/2014 |

OTHER PUBLICATIONS

International Search Report of PCT application No. PCT/JP2016/003463 dated Sep. 20, 2016.

* cited by examiner

HIGH FREQUENCY HEATING DEVICE

TECHNICAL FIELD

The present disclosure relates to a high frequency heating device provided with a surface wave transmission line using a periodic structure.

BACKGROUND ART

Various techniques have been developed to avoid uneven baking in a high frequency heating device which heats an object to be heated such as food by providing high frequency power to a surface wave transmission line using a periodic structure.

For example, Patent Literature 1 discloses a high frequency thawing and heating device which supplies a microwave from two microwave supply ports formed on a surface wave transmission line so as to face each other. According to Patent Literature 1, a surface wave is evenly formed in an entire region of the surface wave transmission line.

Patent Literature 2 discloses a microwave processing device provided with a plurality of surface wave transmission lines and a plurality of power feeding units. In the microwave processing device, each connection position between the two adjacent surface wave transmission lines and the power feeding unit is disposed so as to be shifted in a microwave transmission direction. According to Patent Literature 2, cooking with less uneven baking is performed.

CITATION LIST

Patent Literature

PTL 1: Unexamined Japanese Patent Publication No. H08-166133
PTL 2: Unexamined Japanese Patent Publication No. 2014-116246

SUMMARY OF THE INVENTION

However, according to Patent Literature 1, since the microwave is provided from a plurality of power feeding points to one surface wave transmission line, the microwaves might be interfered and coupled with each other. In this case, the uneven baking becomes conversely more remarkable.

According to Patent Literature 2, the microwaves might be interfered and coupled with each other between the two surface wave transmission lines adjacent to each other. In this case, a distribution of the microwave becomes more complicated, and the uneven baking becomes more remarkable depending on a place.

The present disclosure is provided to solve the conventional problem described above, and an object of the present disclosure is, in a high frequency heating device provided with a surface wave transmission line using a periodic structure, to suppress uneven baking and to control a heating state of an object to be heated easily.

A high frequency heating device according to one aspect of the present disclosure is provided with a mount base on which an object to be heated is mounted, a heater disposed adjacent to the mount base and having one surface wave transmission line or a plurality of surface wave transmission lines electrically isolated from each other, and a first high frequency power generator and a second high frequency power generator, each of which generates high frequency power having different frequency.

The surface wave transmission line or all the plurality of surface wave transmission lines receives or receive at least one of the high frequency power generated by the first high frequency power generator and the high frequency power generated by the second high frequency power generator.

According to the present disclosure, interference between the two high frequency powers is not occurred, and therefore electromagnetic field coupling is not occurred. As a result, uneven baking caused by the electromagnetic field coupling can be suppressed, and a heating state of the object to be heated can be easily controlled.

DETAILED DESCRIPTION OF THE EXEMPLARY EMBODIMENTS

Figure 1:
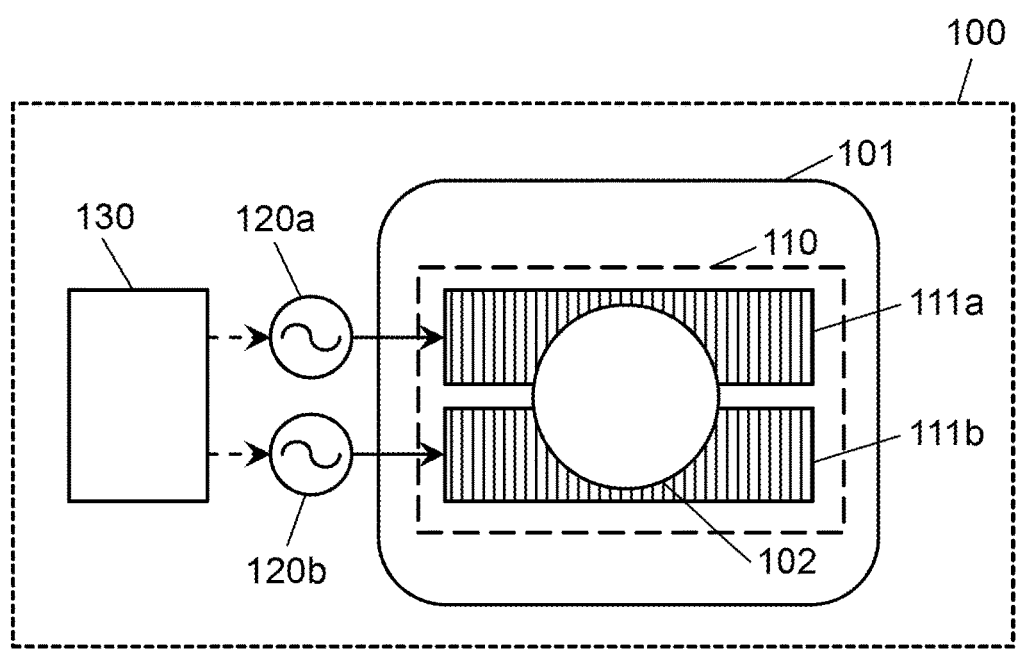
FIG. 1 is a block diagram illustrating a basic configuration of a high frequency heating device according to a first exemplary embodiment of the present disclosure.

A high frequency heating device according to a first aspect of the present disclosure is provided with a mount base on which an object to be heated is mounted, a heater disposed adjacent to the mount base and having one surface wave transmission line or a plurality of surface wave transmission lines electrically isolated from each other, and a first high frequency power generator and a second high frequency power generator, each of which generates high frequency power having different frequency.

The surface wave transmission line or all the plurality of surface wave transmission lines receives or receive at least one of the high frequency power generated by the first high frequency power generator and the high frequency power generated by the second high frequency power generator.

According to a high frequency heating device according to a second aspect of the present disclosure, in the first aspect, the surface wave transmission line or at least one of the plurality of surface wave transmission lines receives both the high frequency power generated by the first high frequency power generator and the high frequency power generated by the second high frequency power generator.

A high frequency heating device according to a third aspect of the present disclosure is further provided with, in addition to the second aspect, a combiner which combines the high frequency power generated by the first high frequency power generator and the high frequency power generated by the second high frequency power generator. The high frequency power combined by the combiner is provided to the surface wave transmission line or at least one of the plurality of surface wave transmission lines.

A high frequency heating device according to a fourth aspect of the present disclosure is further provided with, in addition to the first aspect, a distributer which distributes the high frequency power generated by the first high frequency power generator. The high frequency power distributed by the distributer is provided to at least two of the plurality of surface wave transmission lines.

According to a high frequency heating device according to a fifth aspect of the present disclosure, in the first aspect, the high frequency power generator is formed as a frequency variable type high frequency oscillator which generates the high frequency power having a set frequency.

Hereinafter, exemplary embodiments of the present disclosure are described with reference to drawings. In the description below, the same reference numeral is assigned to the same or a corresponding part, and the repeated description thereof may be omitted.

First Exemplary Embodiment

FIG. 1 is a block diagram illustrating a basic configuration of high frequency heating device 100 according to a first exemplary embodiment of the present disclosure.

As shown in FIG. 1, high frequency heating device 100 is provided with mount base 101, heater 110, high frequency power generator 120a, high frequency power generator 120b, and controller 130.

Object to be heated 102 is mounted on mount base 101. Heater 110 is provided with surface wave transmission line 111a and surface wave transmission line 111b electrically isolated from each other. Surface wave transmission lines 111a, 111b correspond to a first and a second surface wave transmission lines, respectively.

Each of high frequency power generators 120a, 120b generates high frequency power having frequency different from each other. High frequency power generators 120a, 120b correspond to a first and a second high frequency power generators, respectively.

In the present exemplary embodiment, high frequency heating device 100 is provided with the two surface wave transmission lines and the two high frequency power generators, however each of the number of the surface wave transmission lines and the number of the high frequency power generators is not limited to this.

The high frequency power generated by high frequency power generator 120a is provided to surface wave transmission line 111a, and the high frequency power generated by high frequency power generator 120b is provided to surface wave transmission line 111b.

Each of surface wave transmission lines 111a, 111b is formed of a metal periodic structure such as a stub type surface wave transmission line, an inter-digital type surface wave transmission line or the like, or a dielectric plate such as an alumina plate, a Bakelite plate or the like. The stub type surface wave transmission line is formed by arranging a plurality of metal flat plates at regular intervals on a metal flat plate. The inter-digital type surface wave transmission line is formed by punching a metal flat plate in an inter-digitated manner.

Surface wave transmission lines 111a, 111b concentrate the high frequency powers provided from high frequency power generators 120a, 120b on nearby a surface of surface wave transmission lines 111a, 111b to propagate the high frequency powers. When surface wave transmission lines 111a, 111b are disposed adjacent to mount base 101, the high frequency power is concentrated on nearby a surface of mount base 101, and thereby object to be heated 102 on mount base 101 is heated.

Each of high frequency power generators 120a, 120b is formed as a transmitter which generates a high frequency wave (for example, microwave) having frequency and power suitable for heating object to be heated 102. Each of high frequency power generators 120a, 120b may be formed by a magnetron and an inverter power source, or formed by a solid oscillator and a power amplifier.

The magnetron is a vacuum tube for oscillation which generates s strong non-coherent microwave, and the magnetron is used for high output usage with several hundreds of watts to several kilowatts output such as a radar or a microwave oven. An oscillation frequency of the magnetron can be changed by changing a physical size of a bulb which forms the magnetron.

High voltage of several kilovolts is necessary to drive the magnetron, and therefore an inverter power source is generally used as a driving power source for the magnetron. The inverter power source is formed as a power source circuit including a converter circuit having a rectifying function, and an inverter circuit having a step-up function (or a step-down function) and an output frequency converting function.

In this case, controller 130 controls the high frequency powers generated by high frequency power generators 120a, 120b by adjusting a PWM signal input into the inverter circuit.

On the other hand, the solid oscillator is formed as a semiconductor oscillation circuit having a feedback circuit including an electronic part such as a capacitor, an inductor, a resistor or the like, and a transistor, and is used for usage of a communication device. An oscillation frequency of the semiconductor oscillation circuit can be easily changed by changing a resonance frequency of a resonance circuit included in the feedback circuit.

In recent years, a solid oscillator having high output of around 50 watts exists, however a general solid oscillator has output of several tens of milliwatts to several hundreds of milliwatts. Since output of several hundreds of watts is necessary for usage in heating, the high frequency power output from the solid oscillator is generally amplified by a power amplifier.

The power amplifier includes a transistor or the like and amplifies the high frequency power output from the solid oscillator by a predetermined amplification rate. In the present exemplary embodiment, an amplification rate variable type power amplifier is utilized. Controller 130 outputs a control signal to the power amplifier so as to change the amplification rate and thereby controller 130 controls the high frequency powers generated by high frequency power generators 120a, 120b.

An attenuation rate variable type attenuator may be disposed at a front stage or a rear stage of the power amplifier. In this case, controller 130 outputs a control signal to the attenuator so as to change the attenuation rate and thereby controller 130 controls the high frequency powers generated by high frequency power generators 120a, 120b.

In this way, controller 130 controls the high frequency powers generated by high frequency power generators 120a, 120b by controlling high frequency power generators 120a, 120b.

According to the present exemplary embodiment, high frequency heating device 100 can heat object to be heated 102 mounted on mount base 101 by means of the high frequency powers provided to surface wave transmission lines 111a, 111b from high frequency power generators 120a, 120b, respectively.

Heating operation to object to be heated 102 by high frequency heating device 100 is described in detail with reference to FIG. 2A through FIG. 2C.

Figure 2A:
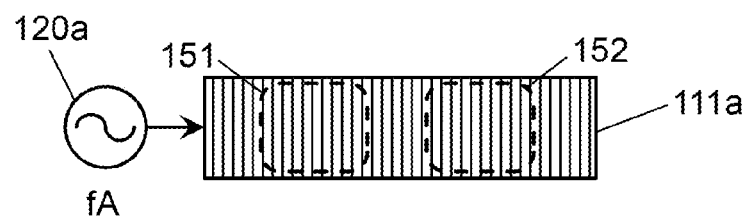
FIG. 2A is a schematic diagram illustrating a distribution of heating intensity in a case in which high frequency power having a frequency fA is provided to a surface wave transmission line.

FIG. 2A schematically illustrates a distribution of heating intensity generated on surface wave transmission line 111a in a case in which the high frequency power having a frequency fA is provided to surface wave transmission line 111a. FIG. 2B schematically illustrates a distribution of heating intensity generated on surface wave transmission line 111b in a case in which the high frequency power having a frequency fB is provided to surface wave transmission line 111b.

Figure 2B:
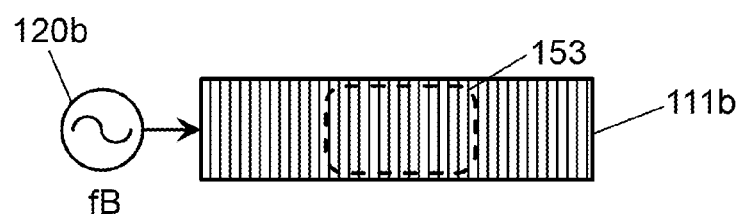
FIG. 2B is a schematic diagram illustrating a distribution of the heating intensity in a case in which high frequency power having a frequency fB is provided to the surface wave transmission line.
Figure 2C:
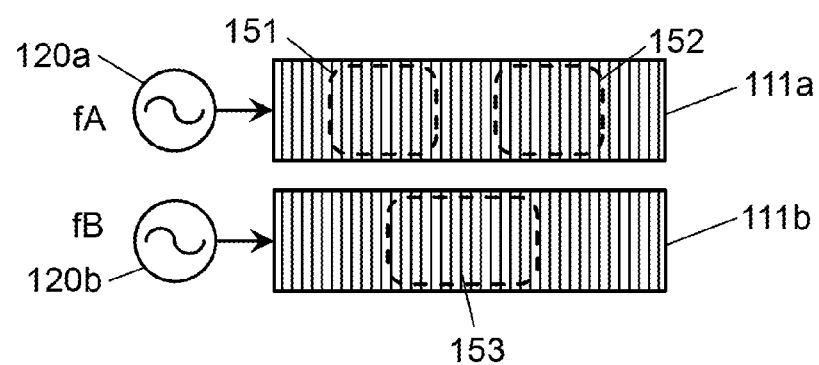
FIG. 2C is a schematic diagram illustrating a distribution of the heating intensity in a case in which two high frequency powers having frequencies different from each other are provided to two surface wave transmission lines respectively.

FIG. 2C schematically illustrates a distribution of heating intensity generated on surface wave transmission lines 111a, 111b in a case in which the high frequency powers having the frequencies fA, fB are provided to surface wave transmission lines 111a, 111b, respectively.

As shown in FIG. 2A, when high frequency power generator 120a provides the high frequency power having the frequency fA to surface wave transmission line 111a, region 151, region 152 having high heating intensity are generated on surface wave transmission line 111a.

As shown in FIG. 2B, when high frequency power generator 120b provides the high frequency power having the frequency fB to surface wave transmission line 111b, region 153 having high heating intensity is generated on surface wave transmission line 111b.

As shown in FIG. 2C, when high frequency power generator 120a provides the high frequency power having the frequency fA to surface wave transmission line 111a, similar to FIG. 2A, region 151, region 152 having the high heating intensity are generated on surface wave transmission line 111a. At the same time, when high frequency power generator 120b provides the high frequency power having the frequency fB to surface wave transmission line 111b, similar to FIG. 2B, region 153 having the high heating intensity is generated on surface wave transmission line 111b.

Namely, surface wave transmission line 111a holds the distribution of the heating intensity in a case in which high frequency power generator 120a provides the high frequency power having the frequency fA, and surface wave transmission line 111b holds the distribution of the heating intensity in a case in which high frequency power generator 120b provides the high frequency power having the frequency fB.

Thus, the distributions of the heating intensity generated on surface wave transmission lines 111a, 111b are not changed. As a result, since interference between the two high frequency powers is not occurred and therefore electromagnetic field coupling is not occurred, uneven baking caused by the electromagnetic field coupling can be suppressed.

Each of high frequency power generators 120a, 120b may be formed of a frequency variable type high frequency oscillator capable of generating the high frequency power having a set frequency.

The frequency variable type high frequency oscillator can be obtained by using a voltage variable element (for example, Varactor Diode) as an element which defines the resonance frequency of the resonance circuit included in the semiconductor oscillation circuit described above.

The frequency variable type high frequency oscillator is generally called as VCO (Voltage Controlled Oscillator). In a case in which the VCO is utilized, controller 130 can easily control the oscillation frequency by adjusting voltage provided to the VCO.

As the frequency variable type high frequency oscillator, a PLL (Phase Locked Loop) oscillator provided with a reference signal generator and a phase comparator can be utilized. In a case in which the PLL is utilized, controller 130 can easily control the oscillation frequency by adjusting a signal provided to the phase comparator.

Namely, high frequency power generators 120a, 120b can be formed as the same configuration. Thus, the high frequency heating device according to the present disclosure can perform heating with various distributions of the heating intensity generated by much more high frequency powers having frequencies different from each other. As a result, the high frequency heating device according to the present disclosure can easily control a heating state of the object to be heated and enhance a quality of the heated object.

In the present exemplary embodiment, a configuration in which heater 110 has the two surface wave transmission lines is described, however the same effect can be obtained by a configuration in which heater 110 has, for example, three surface wave transmission lines. Namely, in a case in which the high frequency powers having frequencies different from each other are provided to the three surface wave transmission lines, the interference between any two of the high frequency powers is not occurred and therefore the electromagnetic field coupling is not occurred. Thus, the distribution of the heating intensity generated on the surface wave transmission line is not changed.

In the present exemplary embodiment, the high frequency powers are provided to surface wave transmission lines 111a, 111b from the same side (left side in the drawings). However, a similar effect can be obtained even when the high frequency powers are provided to surface wave transmission lines 111a, 111b from sides different from each other.

Second Exemplary Embodiment

Hereinafter, a second exemplary embodiment of the present disclosure is described with reference to drawings.

Figure 3:
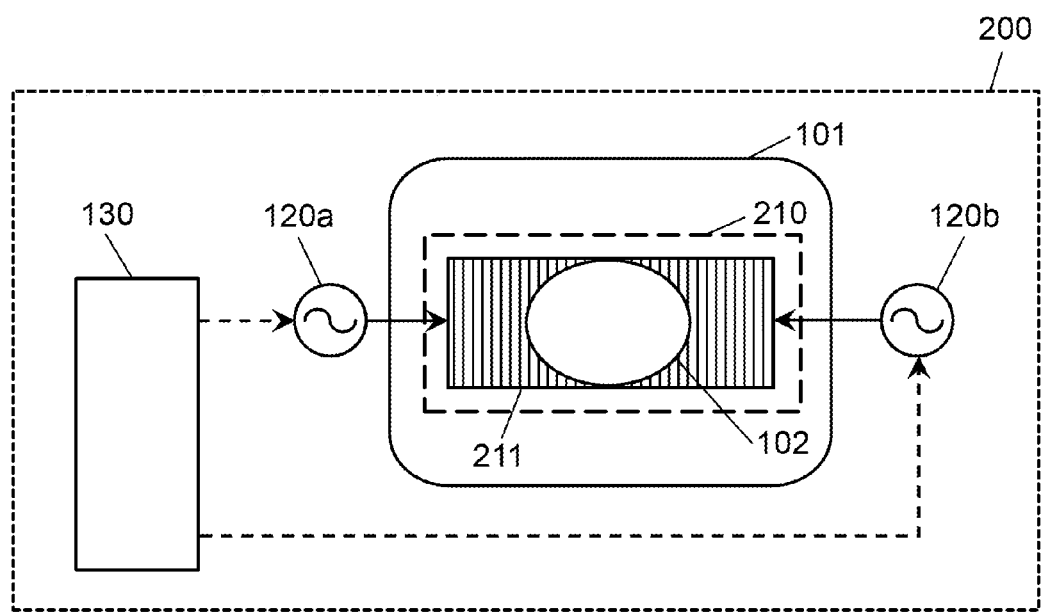
FIG. 3 is a block diagram illustrating a basic configuration of a high frequency heating device according to a second exemplary embodiment of the present disclosure.

FIG. 3 is a block diagram illustrating a configuration of high frequency heating device 200 according to the present exemplary embodiment.

As shown in FIG. 3, high frequency heating device 200 is provided with heater 210 having surface wave transmission line 211.

High frequency power generator 120a, 120b generate high frequency power having frequencies different from each other and provide the high frequency power to power feeding points disposed at a left and a right side end parts of surface wave transmission line 211 respectively. High frequency heating device 200 can heat object to be heated 102 mounted on mount base 101 by the high frequency powers provided to surface wave transmission line 211 from high frequency power generators 120a, 120b.

Heating operation to object to be heated 102 by high frequency heating device 200 is described in detail with reference to FIG. 4A through FIG. 4C.

Figure 4A:
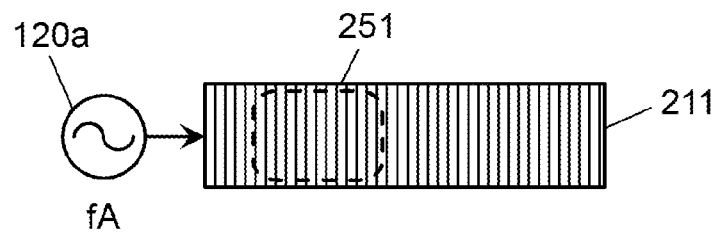
FIG. 4A is a schematic diagram illustrating a distribution of heating intensity in a case in which high frequency power having a frequency fA is provided to a surface wave transmission line.

FIG. 4A schematically illustrates a distribution of heating intensity generated on surface wave transmission line 211 in a case in which the high frequency power having a frequency fA is provided to surface wave transmission line 211. FIG. 4B schematically illustrates a distribution of heating intensity generated on surface wave transmission line 211 in a case in which the high frequency power having a frequency fB is provided to surface wave transmission line 211. FIG. 4C schematically illustrates a distribution of heating intensity generated on surface wave transmission line 211 in a case in which the high frequency powers having frequencies fA, fB are provided to surface wave transmission line 211.

As shown in FIG. 4A, when high frequency power generator 120a provides the high frequency power having the frequency fA to surface wave transmission line 211 from a left side, region 251 having high heating intensity is generated on surface wave transmission line 211.

Figure 4B:
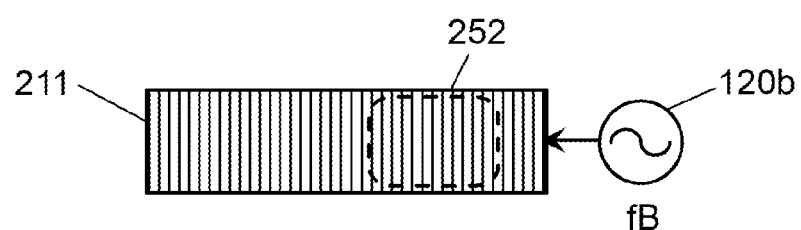
FIG. 4B is a schematic diagram illustrating a distribution of the heating intensity in a case in which high frequency power having a frequency fB is provided to the surface wave transmission line.

As shown in FIG. 4B, when high frequency power generator 120b provides the high frequency power having the frequency fB to surface wave transmission line 211 from a right side, region 252 having high heating intensity is generated on surface wave transmission line 211.

Figure 4C:
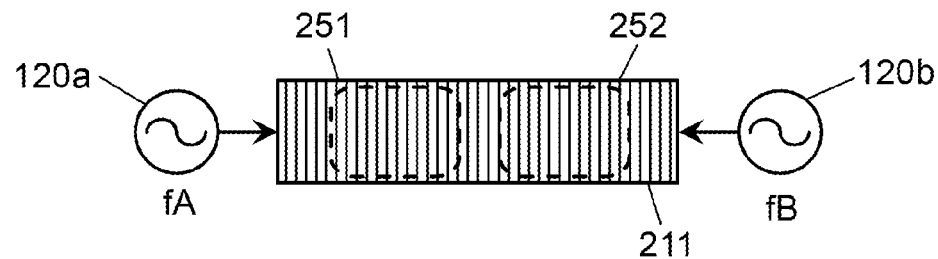
FIG. 4C is a schematic diagram illustrating a distribution of the heating intensity in a case in which two high frequency powers having frequencies different from each other are provided to one surface wave transmission line.

As shown in FIG. 4C, when high frequency power generator 120a provides the high frequency power having the frequency fA to surface wave transmission line 211 from the left side and at the same time high frequency power generator 120b provides the high frequency power having the frequency fB to surface wave transmission line 211 from the right side, similar to FIG. 4A, FIG. 4B, region 251, region 252 having high heating intensity are generated on surface wave transmission line 211.

Namely, surface wave transmission line 211 holds the distribution of the heating intensity in a case in which high frequency power generator 120a provides only the high frequency power having the frequency fA and the distribution of the heating intensity in a case in which high frequency power generator 120b provides only the high frequency power having the frequency fB.

Thus, the distribution of the heating intensity generated on surface wave transmission line 211 is not changed. As a result, since interference between the two high frequency powers is not occurred and therefore electromagnetic field coupling is not occurred, uneven baking caused by the electromagnetic field coupling can be suppressed.

In FIG. 4A through FIG. 4C, a configuration in which the two high frequency power generators provide the high frequency powers having the frequencies different from each other to the one surface wave transmission line is described as an example. However, a similar effect can be obtained by a configuration in which three or more high frequency power generators provide the high frequency powers having the frequencies different from each other to the one surface wave transmission line.

Namely, according to the present exemplary embodiment, by providing the high frequency powers having the frequencies different from each other, a plurality of patterns of the heating intensity can be generated simultaneously on the one surface wave transmission line. Thus, since the surface wave transmission line can be used efficiently, downsizing of the device and cost reduction can be achieved.

In the present exemplary embodiment, the high frequency powers are provided to the power feeding points disposed at the left and the right side end parts of surface wave transmission line 211 from high frequency power generators 120a, 120b, respectively. However, a similar effect can be obtained even when the high frequency power is provided from other place.

Third Exemplary Embodiment

Hereinafter, a third exemplary embodiment of the present disclosure is described with reference to drawings.

Figure 5:
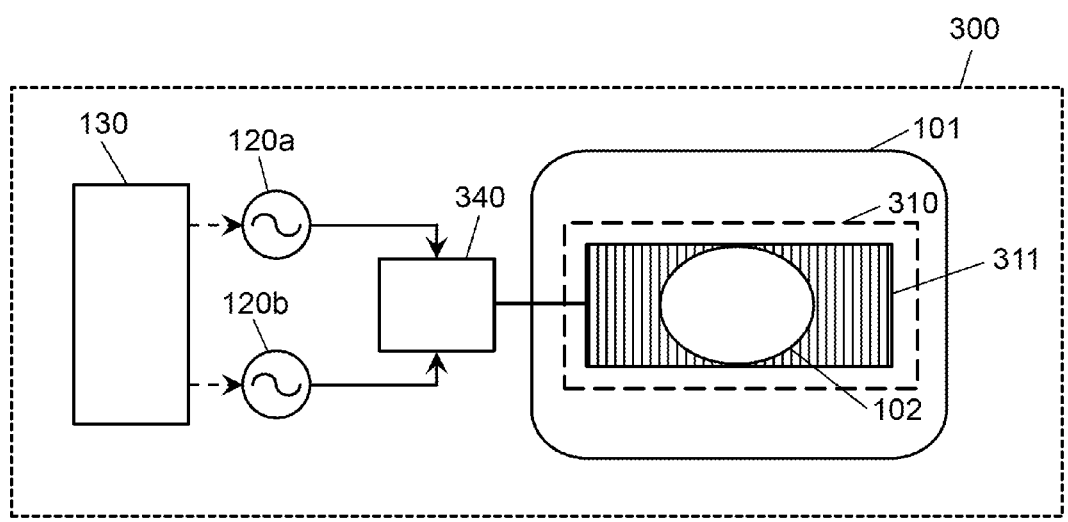
FIG. 5 is a block diagram illustrating a basic configuration of a high frequency heating device according to a third exemplary embodiment of the present disclosure.

FIG. 5 is a block diagram illustrating a configuration of high frequency heating device 300 according to the present exemplary embodiment.

As shown in FIG. 5, high frequency heating device 300 is provided with heater 310 having surface wave transmission line 311, and combiner 340.

Combiner 340 receives the high frequency power generated by high frequency power generator 120a and the high frequency power generated by high frequency power generator 120b, and provides high frequency power in which the two received high frequency powers are combined to surface wave transmission line 311.

In a case in which the two received high frequency powers have the same frequency, combiner 340 outputs the sum of vectors of the two received high frequency powers, while in a case in which the two received high frequency powers have the frequencies different from each other, combiner 340 outputs the sum of the two received high frequency powers. Wilkinson coupler, Hybrid coupler, or the like can be adopted to combiner 340.

High frequency heating device 300 can heat object to be heated 102 mounted on mount base 101 by the high frequency powers provided to surface wave transmission line 311 from high frequency power generators 120a, 120b.

Heating operation to object to be heated 102 by high frequency heating device 300 is described in detail with reference to FIG. 6A through FIG. 6C.

Figure 6A:
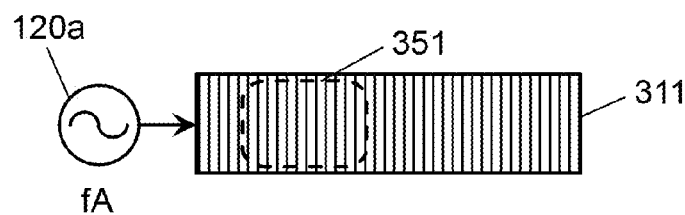
FIG. 6A is a schematic diagram illustrating a distribution of heating intensity in a case in which high frequency power having a frequency fA is provided to a surface wave transmission line.

FIG. 6A schematically illustrates a distribution of heating intensity generated on surface wave transmission line 311 in a case in which the high frequency power having a frequency fA is provided to surface wave transmission line 311. FIG. 6B schematically illustrates a distribution of heating intensity generated on surface wave transmission line 311 in a case in which the high frequency power having a frequency fB is provided to surface wave transmission line 311. FIG. 6C schematically illustrates a distribution of heating intensity generated on surface wave transmission line 311 in a case in which the high frequency powers having frequencies fA, fB are combined by combiner 340 and provided to surface wave transmission line 311.

As shown in FIG. 6A, when high frequency power generator 120a provides the high frequency power having the frequency fA to surface wave transmission line 311, region 351 having high heating intensity is generated on surface wave transmission line 311.

Figure 6B:
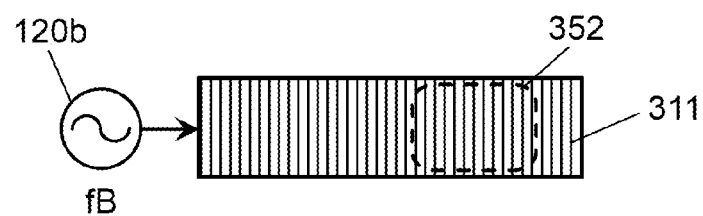
FIG. 6B is a schematic diagram illustrating a distribution of the heating intensity in a case in which high frequency power having a frequency fB is provided to the surface wave transmission line.

As shown in FIG. 6B, when high frequency power generator 120b provides the high frequency power having the frequency fB to surface wave transmission line 311, region 352 having high heating intensity is generated on surface wave transmission line 311.

Figure 6C:
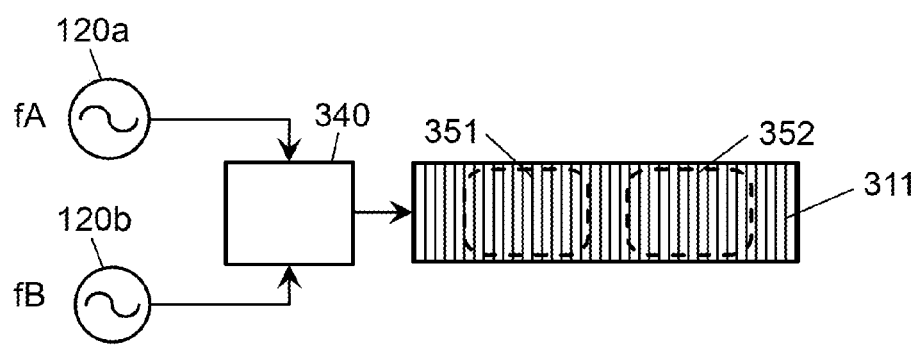
FIG. 6C is a schematic diagram illustrating a distribution of the heating intensity in a case in which two high frequency powers having frequencies different from each other are combined and then provided to one surface wave transmission line.

As shown in FIG. 6C, when combiner 340 combines the high frequency power having the frequency fA generated by high frequency power generator 120a and the high frequency power having the frequency fB generated by high frequency power generator 120b and provides the combined high frequency power to surface wave transmission line 311, region 351, region 352 having high heating intensity are generated on surface wave transmission line 311.

Namely, surface wave transmission line 311 holds the distribution of the heating intensity in a case in which high frequency power generator 120a provides only the high frequency power having the frequency fA and the distribution of the heating intensity in a case in which high frequency power generator 120b provides only the high frequency power having the frequency fB.

Thus, the distribution of the heating intensity generated on surface wave transmission line 311 is not changed. As a result, since interference between the two high frequency powers is not occurred and therefore electromagnetic field coupling is not occurred, uneven baking caused by the electromagnetic field coupling can be suppressed.

FIG. 6A through FIG. 6C illustrate a configuration in which combiner 340 combines the two high frequency powers having the frequencies different from each other as an example. However, a similar effect can be obtained by a configuration in which combiner 340 combines more than three high frequency powers having frequencies different from each other.

Namely, according to the present exemplary embodiment, by providing the plurality of high frequency powers having the frequencies different from each other, a plurality of patterns of the heating intensity can be generated simultaneously on the one surface wave transmission line. Thus, since the surface wave transmission line can be used efficiently, downsizing of the device and cost reduction can be achieved.

In the present exemplary embodiment, high frequency heating device 300 has the one surface wave transmission line, the two high frequency power generators, and the one combiner. However, each of the number of the surface wave transmission lines, the number of the high frequency power generators, and the number of the combiners is not limited to this.

Fourth Exemplary Embodiment

Hereinafter, a fourth exemplary embodiment of the present disclosure is described with reference to drawings.

Figure 7:
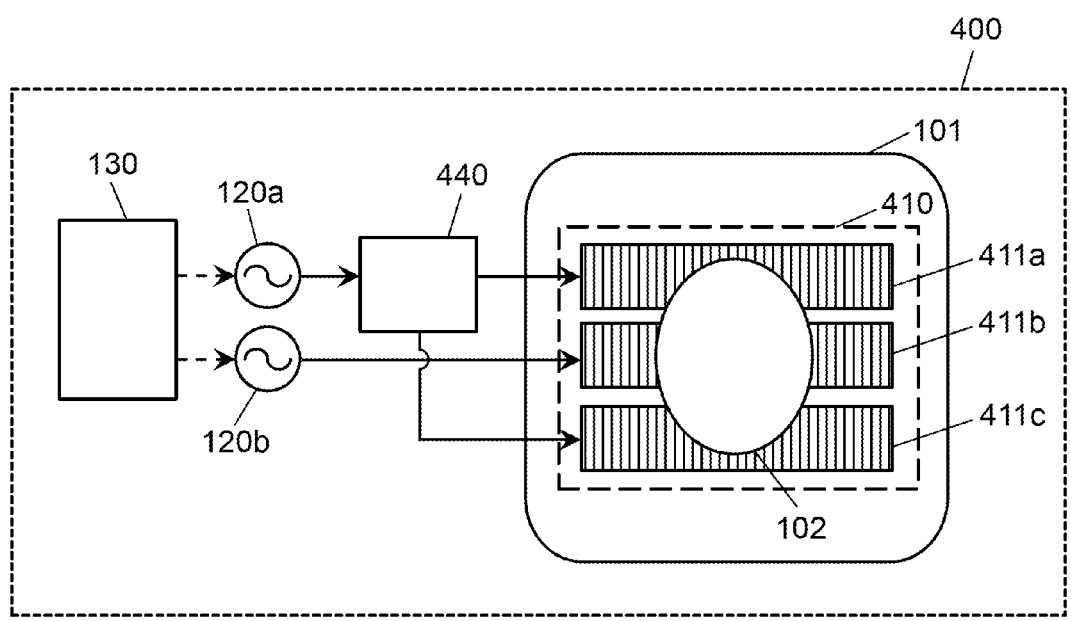
FIG. 7 is a block diagram illustrating a basic configuration of a high frequency heating device according to a fourth exemplary embodiment of the present disclosure.

FIG. 7 is a block diagram illustrating a configuration of high frequency heating device 400 according to the present exemplary embodiment.

As shown in FIG. 7, high frequency heating device 400 is provided with heater 410 and distributer 440. Heater 410 is provided with surface wave transmission line 411a, surface wave transmission line 411b, and surface wave transmission line 411c.

Surface wave transmission lines 411a, 411b are disposed adjacent to each other, and surface wave transmission lines 411b, 411c are disposed adjacent to each other. Namely, surface wave transmission line 411b is disposed between surface wave transmission line 411a and surface wave transmission line 411c. Surface wave transmission lines 411a, 411b, 411c are electrically isolated from each other. Surface wave transmission lines 411a, 411b, 411c correspond to a first, a second and a third surface wave transmission lines, respectively.

Distributer 440 receives the high frequency power generated by high frequency power generator 120a and distributes the high frequency power to surface wave transmission line 411a and surface wave transmission line 41c. Wilkinson coupler, Hybrid coupler or the like can be adopted to distributer 440.

Surface wave transmission line 411b receives the high frequency power, which is generated by high frequency power generator 120b, having a frequency different from a frequency of the high frequency power generated by high frequency power generator 120a.

High frequency heating device 400 can heat object to be heated 102 mounted on mount base 101 by the high frequency powers provided to surface wave transmission lines 411a, 411b, 411c from high frequency power generators 120a, 120b.

Heating operation to object to be heated 102 by high frequency heating device 400 is described in detail with reference to FIG. 8A through FIG. 8D.

Figure 8A:
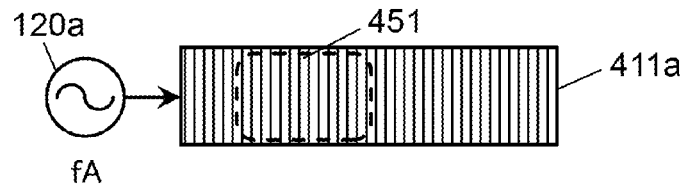
FIG. 8A is a schematic diagram illustrating a distribution of heating intensity in a case in which high frequency power having a frequency fA is provided to a surface wave transmission line.
Figure 8B:
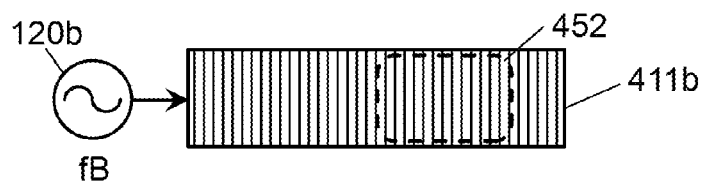
FIG. 8B is a schematic diagram illustrating a distribution of the heating intensity in a case in which high frequency power having a frequency fB is provided to the surface wave transmission line.

FIG. 8A schematically illustrates a distribution of heating intensity generated on surface wave transmission line 411a in a case in which the high frequency power having a frequency fA is provided to surface wave transmission line 411a. FIG. 8B schematically illustrates a distribution of heating intensity generated on surface wave transmission line 411b in a case in which the high frequency power having a frequency fB is provided to surface wave transmission line 411b.

Figure 8C:
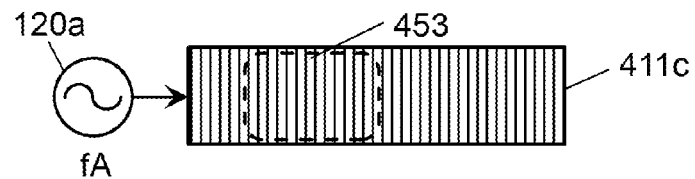
FIG. 8C is a schematic diagram illustrating a distribution of the heating intensity in a case in which the high frequency power having the frequency fA is provided to the surface wave transmission line.
Figure 8D:
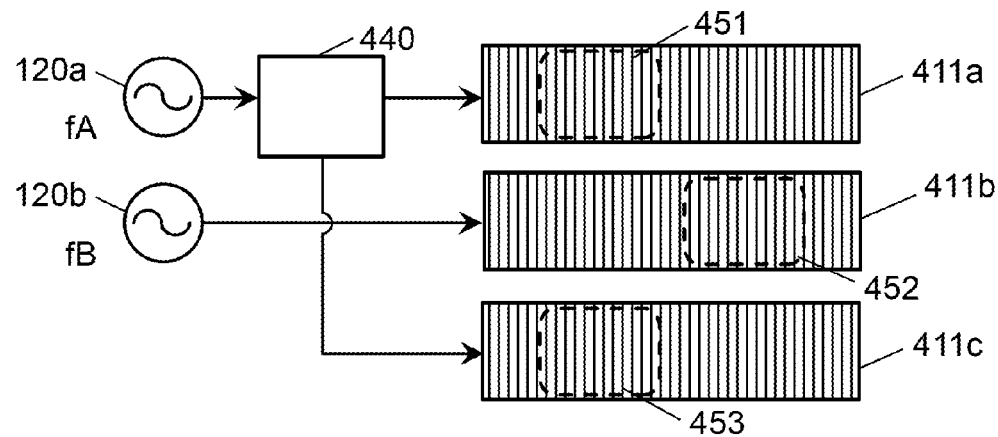
FIG. 8D is a schematic diagram illustrating a distribution of the heating intensity in a case in which the high frequency power having the frequency fA is distributed and then provided to two surface wave transmission lines among three surface wave transmission lines and the high frequency power having the frequency fB is provided to another surface wave transmission line.

FIG. 8C schematically illustrates a distribution of heating intensity generated on surface wave transmission line 411c in a case in which the high frequency power having the frequency fB is provided to surface wave transmission line 411c. FIG. 8D schematically illustrates a distribution of heating intensity generated on surface wave transmission lines 411a through 411c in a case in which the high frequency power having the frequency fA is distributed by distributer 440 and provided to surface wave transmission lines 411a, 411b and the high frequency power having the frequency fB is provided to surface wave transmission line 411b.

As shown in FIG. 8A, when high frequency power generator 120a provides the high frequency power having the frequency fA to surface wave transmission line 411a, region 451 having high heating intensity is generated on surface wave transmission line 411a.

As shown in FIG. 8B, when high frequency power generator 120b provides the high frequency power having the frequency fB to surface wave transmission line 411b, region 452 having high heating intensity is generated on surface wave transmission line 411b.

As shown in FIG. 8C, when high frequency power generator 120a provides the high frequency power having the frequency fA to surface wave transmission line 411b, region 453 having high heating intensity is generated on surface wave transmission line 411c.

As shown in FIG. 8D, distributer 440 distributes the high frequency power having the frequency fA generated by high frequency power generator 120a to provide the high frequency power having the frequency fA to surface wave transmission line 411a and surface wave transmission line 411c. High frequency power generator 120b provides the high frequency power having the frequency fB to surface wave transmission line 411b. At this time, regions 451, 452, 453 having high heating intensity are generated on surface wave transmission lines 411a, 411b, 411c, respectively.

Namely, surface wave transmission lines 411a, 411c hold the distribution of the heating intensity in a case in which the high frequency power having the frequency fA is provided. Surface wave transmission line 411b holds the distribution of the heating intensity in a case in which the high frequency power having the frequency fB is provided.

Thus, the distributions of the heating intensity generated on surface wave transmission lines 411a through 411c are not changed. As a result, since interference between the high frequency powers propagated through surface wave transmission lines 411a through 411c is not occurred and therefore electromagnetic field coupling is not occurred, uneven baking caused by the electromagnetic field coupling can be suppressed.

In the present exemplary embodiment, a configuration in which distributer 440 distributes the high frequency power generated by high frequency power generator 120a to provide the high frequency power to surface wave transmission lines 411a, 411c disposed not to be adjacent to each other is described as an example, however a similar effect can be obtained by a configuration in which the high frequency power is distributed to more than three surface wave transmission lines. Namely, in a case in which the high frequency power having the same frequency is provided to the two surface wave transmission lines disposed not to be adjacent to each other and the high frequency power having different frequency is provided to the surface wave transmission line disposed between them, the interference between any two of the high frequency powers is not occurred and therefore the electromagnetic field coupling is not occurred. Thus, the distribution of the heating intensity generated on the surface wave transmission line is not changed.

According to the present exemplary embodiment, one high frequency power generator is used commonly to a plurality of surface wave transmission lines, and this configuration eliminates the need for disposing the same number of the high frequency power generators as the surface wave transmission lines. Thus, downsizing of the device and cost reduction can be achieved.

In the present exemplary embodiment, high frequency heating device 400 is provided with the three surface wave transmission lines, the two high frequency power generators, and the one distributer. However, each of the number of the surface wave transmission lines, the number of the high frequency power generators, and the number of the distributer is not limited to this.

INDUSTRIAL APPLICABILITY

The high frequency heating device according to the present disclosure can be applied to an electric cooking apparatus.

REFERENCE MARKS IN THE DRAWINGS 100, 200, 300, 400: high frequency heating device
101: mount base
102: object to be heated
110, 210, 310, 410: heater
111a, 111b, 211, 311, 411a, 411b, 411c: surface wave transmission line
120a, 120b: high frequency power generator
130: controller
151, 152, 153, 251, 252, 351, 352, 451, 452, 453: region
340: combiner
440: distributer

What is claimed is:

1. A high-frequency heating device comprising:
a mount base on which an object to be heated is mounted;
a heater disposed adjacent to the mount base and having one surface wave transmission line or a plurality of surface wave transmission lines electrically isolated from each other, the surface wave transmission line or the plurality of surface wave transmission lines concentrating high-frequency power on nearby surfaces thereof to form a high heating intensity region and to propagate the high-frequency power; and
a first high-frequency power generator and a second high-frequency power generator, each of which generates the high-frequency power having different frequency,
wherein
the surface wave transmission line or all the plurality of surface wave transmission lines receives or receive at least one of the high-frequency power generated by the first high-frequency power generator and the high-frequency power generated by the second high-frequency power generator.

2. The high-frequency heating device according to claim 1, wherein
the surface wave transmission line or at least one of the plurality of surface wave transmission lines receives both the high-frequency power generated by the first high-frequency power generator and the high-frequency power generated by the second high frequency power generator.

3. The high-frequency heating device according to claim 2, further comprising
a combiner which combines the high-frequency power generated by the first high-frequency power generator with the high-frequency power generated by the second high-frequency power generator, wherein
the high-frequency power combined by the combiner is provided to the surface wave transmission line or the at least one of the plurality of surface wave transmission lines.

4. The high-frequency heating device according to claim 1, further comprising
a distributer which distributes the high-frequency power generated by the first high-frequency power generator, wherein
the high-frequency power distributed by the distributer is provided to at least two of the plurality of surface wave transmission lines.

5. The high-frequency heating device according to claim 1, wherein
each of the first and second high-frequency power generators is formed of a frequency variable type high-frequency oscillator which generates the high-frequency power having a set frequency.

* * * * *